United States Patent [19]

Panter

[11] Patent Number: 5,212,621
[45] Date of Patent: May 18, 1993

[54] PROXIMITY SWITCHED MACHINE CONTROL METHOD AND APPARATUS

[75] Inventor: Ronald L. Panter, Clio, Mich.

[73] Assignee: CNC Retrofits, Inc., Mt. Morris, Mich.

[21] Appl. No.: 514,770

[22] Filed: Apr. 26, 1990

[51] Int. Cl.$^5$ .................... H01H 9/26; H01H 36/00
[52] U.S. Cl. ...................... 361/181; 192/131 R; 307/328; 361/280
[58] Field of Search ............ 307/38, 39, 308, 326, 307/328, 112, 116, 140, 141.4; 361/160, 170, 179, 181, 280; 200/600, 50 C, 61.85; 328/5, 7; 83/DIG. 1; 192/129 R, 129 A, 130, 131 R, 131 H, 132; 318/16

[56] References Cited

U.S. PATENT DOCUMENTS

| | | | |
|---|---|---|---|
| 4,016,490 | 4/1977 | Weckenmann et al. | 361/181 X |
| 4,290,052 | 9/1981 | Eichelberger et al. | 340/365 C |
| 4,304,976 | 12/1981 | Gottbreht et al. | 219/10.55 B |
| 4,412,268 | 10/1983 | Dassow | 361/181 |
| 4,486,811 | 12/1984 | Kamiya et al. | 361/280 |
| 4,760,490 | 7/1988 | Murao | 361/181 |
| 4,918,560 | 4/1990 | Storer | 361/190 |

*Primary Examiner*—A. D. Pellinen
*Assistant Examiner*—David Osborn
*Attorney, Agent, or Firm*—Learman & McCulloch

[57] ABSTRACT

A control station for a machine is equipped with capacitive proximity sensors in two locations for sensing the presence of operator's hands at the locations. The sensors are enclosed in a protective housing behind exterior target surfaces forming exterior wall surfaces of the enclosure and are supplied by a voltage source. A relay in series with each sensor and the voltage source is actuated when the operators hands are both sensed. Each sensor generates an electrical field extending outwardly a predetermined distance forwardly beyond each target surface for sensing an operators hands which are outside the enclosure within the field and need not be in tactile contact with the target surfaces. Only when both hands are sensed do the relays indicate operation of the machine.

5 Claims, 2 Drawing Sheets

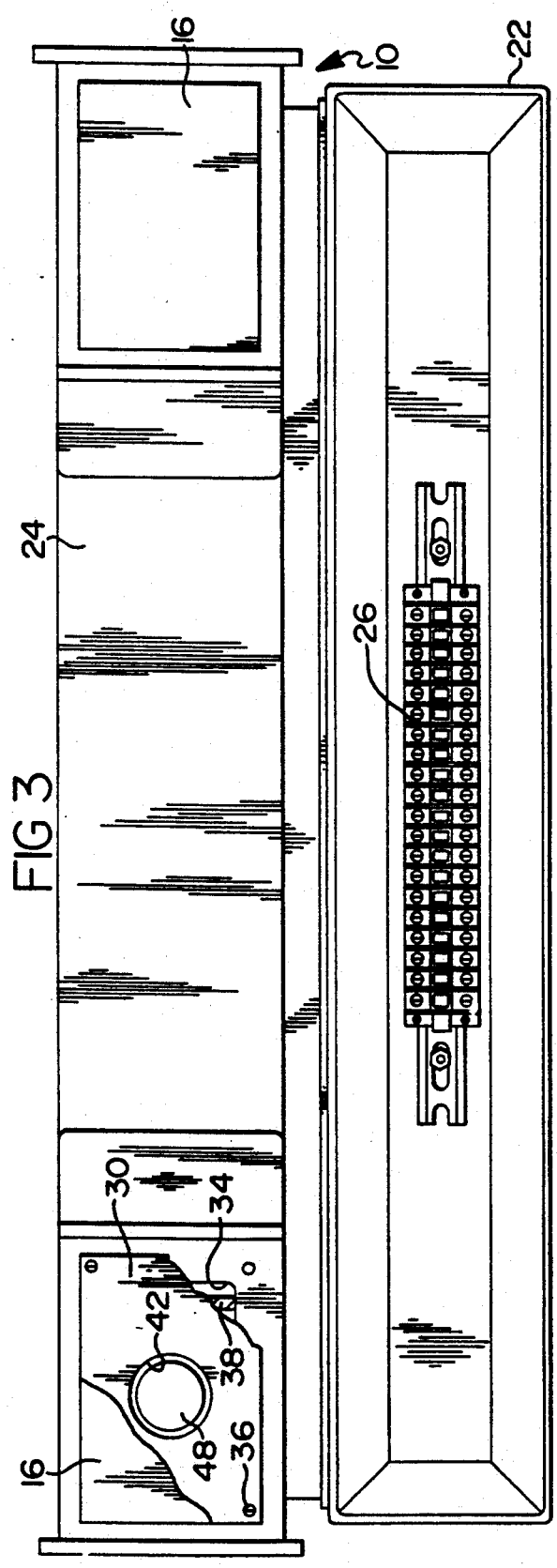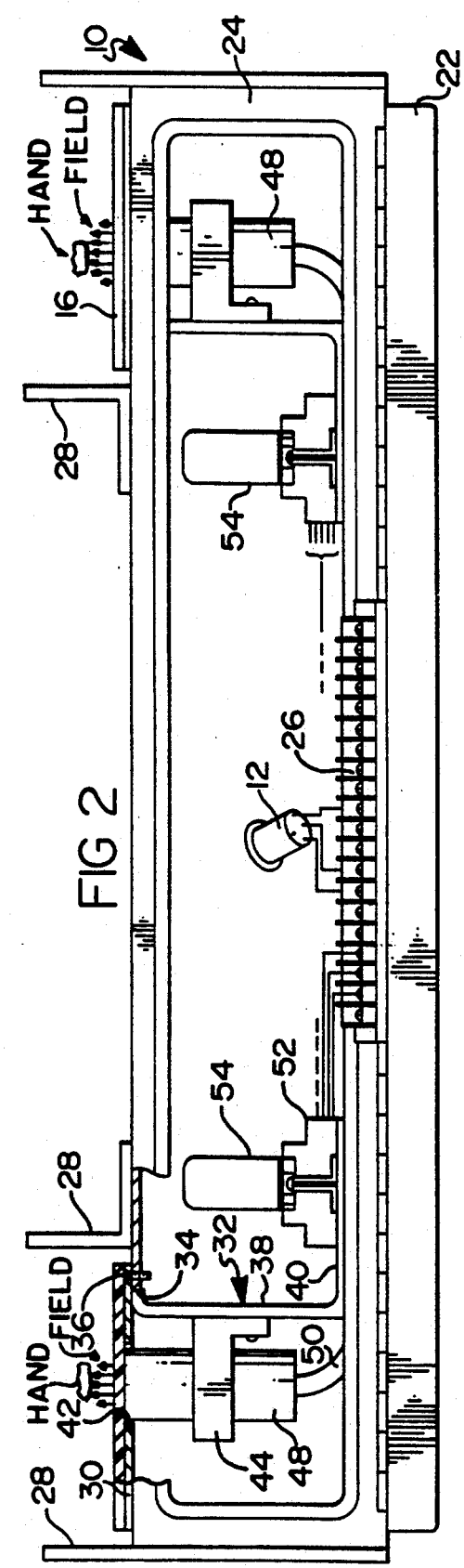

PROXIMITY SWITCHED MACHINE CONTROL METHOD AND APPARATUS

FIELD OF THE INVENTION

This invention relates to a method and apparatus for machine controls and particularly to such controls for machine operation without physical operator force.

BACKGROUND OF THE INVENTION

In the control of industrial presses and many other machines it is a safety requirement that the operators hands be at a control station to assure that they are not in the press or other machine during operation. This requirement is ordinarily carried out by providing two spaced palm buttons at the control station which must be depressed, one by each hand, to initiate machine operation. Some controls have just one palm button for machine control while others have several such buttons. Frequently, the palm buttons require considerable force. In any event, it has been learned that repeated operation of the palm switches over long periods can result in a painful condition in the operators wrists known as carpal tunnel syndrome which leads to disability of the operators.

SUMMARY OF THE INVENTION

It is therefore an object of the invention to provide a hand control for industrial machines which affords the safety features of the prior controls but does not require the repetitive pressing of the palm buttons. It is another object to provide such a control which can be operated by one who is already afflicted with carpal tunnel syndrome. It is a further object to provide a method of machine control without physical operator force.

The invention is carried out by an operator control for enabling machine operation without actuation of a push button comprising: a voltage supply, a protective enclosure, a capacitive proximity sensor inside the enclosure and having an electrical field extending outside the enclosure for sensing an operator's and outside the enclosure and within the field, a relay coupled in circuit with the voltage supply and the sensor for operation of relay contacts upon sensing an operator's hand, and terminal means for connecting the relay contacts to a control output.

The invention is further carried out by a method utilizing such an operator control including the steps of placing a hand adjacent to the enclosure and within the electrical field, and operating the relay to activate a machine control which permits operation of the machine.

BRIEF DESCRIPTION OF THE DRAWINGS

The above and other advantages of the invention will become more apparent from the following description taken in conjunction with the accompanying drawings wherein like references refer to like parts and wherein:

FIGS. 2 and 3 are partly broken away front and top views of a control station according to the invention.

DESCRIPTION OF THE INVENTION

Figure 1:
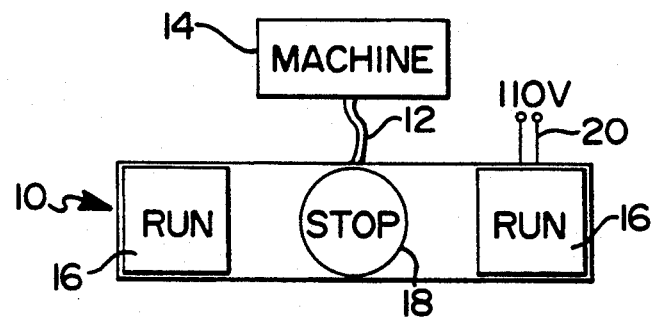
FIG. 1 is a schematic view of a machine and control system according to the invention.

Referring to FIG. 1, an operator control station 10 is connected by a cable 12 to a machine 14 such as a press under control of an operator. The control station has spaced left and right cover panels 16 located at opposite ends of the station 10 where the operator can conveniently reach them. These panels 16 provide target surfaces for the hands. An emergency stop button 18 is located in the center of the control station. Conductors 20 are provided for connection to 110 v power.

The control station 10 is shown in detail in FIGS. 2 and 3 which respectively depict the front and top views of the station 10 shown with the front panel 22 open. The station 10 comprises a steel enclosure 24 in the form of an elongated box with the front panel 22 hinged for access to the interior. A terminal strip 26 is mounted on the front panel for easy access to electrical connections. The individual conductors of cable 12 are connected to the terminal strip as well as the 110 v conductors 20. The cover panels 16 are located on the upper surface of the enclosure 24 at either end. An upstanding guard 28 is positioned on either side of each cover panel 16.

As best shown in the broken away sections of FIGS. 2 and 3, each cover panel 16 comprises a polymer or other nonconductive panel bonded to the upper plate 30 of a bracket 32. The upper plate 30 comprises a flat steel sheet which covers a rectangular aperture 34 in the enclosure and is secured by fasteners 36 to the enclosure at the margins of the aperture. The bracket is generally Z-shaped having a middle portion 38 perpendicular to the upper plate 30 and a lower portion 40 parallel to the plate 30. The middle and lower portions extend into the enclosure 24 and are supported by the upper plate 30. The upper plate 30 has a central circular aperture 42 and the middle portion of the bracket 32 supports a sensor holder 44 having a bore aligned with the aperture 42. A cylindrical sensor 48 is snugly held in the bore of the holder 44 and the end of the sensor extends toward the panel 16 and intrudes into the aperture 42. Electrical leads 50 trail from the lower end of the sensor. The lower portion 40 of the bracket 32 supports a relay socket 52 which, in turn, supports a relay 54.

The sensor 48 is a capacitive proximity sensor which responds to the presence of the operator's hand (FIG. 2) in front of the cover panel 16. The sensor may be, for example a class 9006 type DPJ-A21 proximity switch available from Square D Co. The sensor produces an electric field that radiates from its upper face adjacent the panel 16 and has a sensitivity adjustment which allows the effective field to extend a desired amount beyond the panel 16. It responds to a hand entering the field and can be adjusted to switch when the hand approaches within a given distance of the panel. Where the operator must wear heavy leather gloves, for example, the sensitivity can be adjusted to switch when the gloved hand nearly touches the panel. In any event, no force on the panel 16 is necessary and even contact with the panel is not required.

The relay 54 is preferably a four pole plug in-relay such as a class 8501 type KU-12 relay from Square D Co. The relay terminals are each wired to a terminal on the terminal strip 26 and the cable 12 conductors are selectively wired to the terminals to achieve the desired switching function. The sensor 48 and the relay 54, in combination comprise a switch which is the electrical equivalent of a conventional palm button switch.

Figure 4:
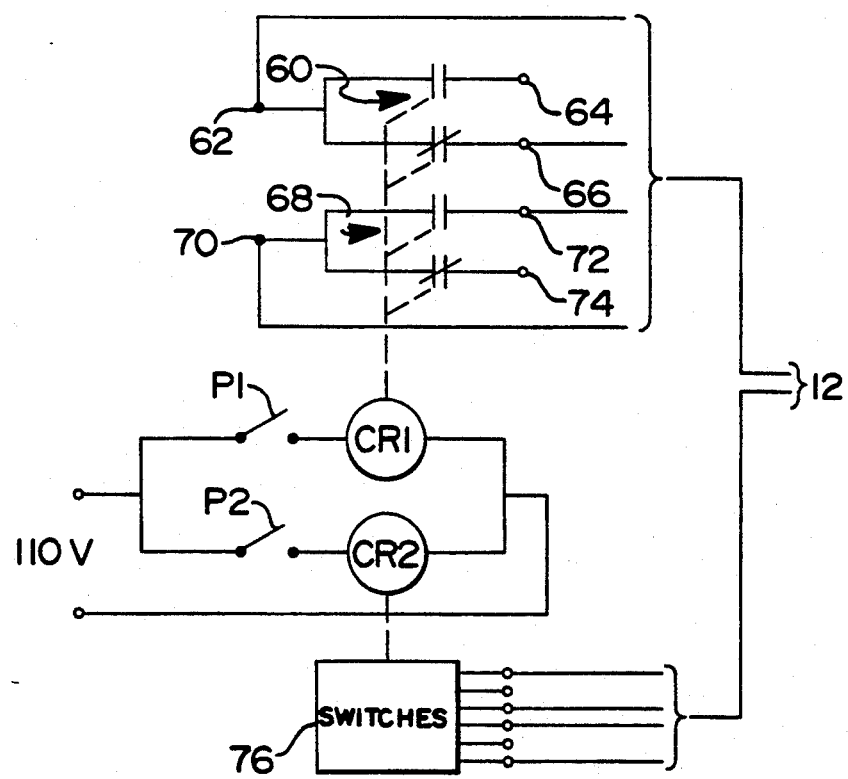
FIG. 4 is an electrical diagram of the control according to the invention.

FIG. 4 illustrates a typical switching arrangement where the two proximity sensors are denoted P1 and P2, and the associated relays 54 are called CR1 and CR2. Sensor P1 and relay CR1 are serially connected across a 110 v source and sensor P2 and relay CR2 are similarly connected. The sensors P1 and P2 are normally open switches and when they are closed, the corresponding relay is actuated. The relays are the same and each has four sets of switches, two normally closed and two normally open, arranged in pairs. When a relay is actuated, all its switches change state. One pair 60 have a common terminal 62 and separate terminals 64 and 66, and include a normally open switch and a normally closed switch. The other pair 68 has the same configuration and has a common terminal 70 and separate terminals 72 and 74. The relay CR2 is the same, the switches being indicated as a block 76. The preferred wiring is dependent on the particular machine specification. The wiring shown in FIG. 4 illustrates certain conductors of the cable 12 connected to selected terminals of the relays CR1 and CR2 and is typical for an anti-repeat, anti-tiedown capability. The connections between cable 12 and the relay switches are made through the terminal strip 26.

It will thus be seen that the control station 10 replicates the switching function of the palm button switches of conventional controls but requires the operator only to present both hands to the cover panel locations, thereby avoiding the physical stress of repeatedly applying pressure to buttons. Not all control stations have two control switches since more or less may be needed for certain operations. In any event each switch may be replaced by the sensor/relay combination. The particular enclosure and mounting arrangement of this disclosure may not always be needed to carry out the invention. For example, if an enclosure is nonconductive, no aperture is needed in the enclosure wall adjacent the sensor since the electrical field will penetrate the wall to detect the hand.

The embodiments of the invention in which an exclusive property or privilege is claimed are defined as follows:

1. A pressure-free operator station for a machine, having a control output for connection to said machine, and comprising:
   a voltage supply circuit,
   a protective enclosure having a pair of exposed, spaced apart exterior targets forming exterior portions of the enclosure,
   a capacitive proximity sensor in the circuit inside the enclosure behind each target and generating an electrical field extending outwardly a predetermined distance forwardly beyond the respective exterior target in a local area for sensing an operator's respective hand which can but need not touch the targets,
   activatable elements coupled in circuit with the voltage supply and the sensors for operating the machine upon sensing an operator's hands near the respective targets, and
   means for connecting the activatable elements to said control output.

2. A pressure-free operator control station in combination with an industrial machine press to be activated comprising:
   a voltage supply circuit,
   a protective enclosure structure having substantially spaced exposed exterior target surfaces forming exterior portions of the enclosure,
   a plurality of capacitive proximity sensors inside the enclosure structure behind said target surfaces, each sensor generating an electrical field extending outwardly a predetermined distance forwardly beyond the respective target surface on the enclosure in a local area for sensing an operator's hand outside the enclosure structure and within the field, and each sensor having a normally open switch which is closed upon sensing said hand,
   a control output for connection to said machine,
   activatable elements coupled in circuit with the voltage supply means and the sensor switches for operating the press upon sensing an operator's two hands near the respective targets, and
   means for connecting the activatable elements to said control output.

3. A pressure-free operator control station having a control output for connection to a machine comprising:
   a metal housing,
   a plurality of relatively widely spaced sensing apertures in the housing, nonmetallic non-conductive covers secured to the housing over each aperture and having exposed exterior surfaces providing accessible exterior target surfaces forming exterior wall portions of the enclosure and shielding each aperture;
   capacitive proximity sensors inside the housing and close to each aperture for sensing an operator's hand at any target surface outside the housing, each sensor generating an electrical field extending outwardly a predetermined distance forwardly beyond the exterior target surface and including a normally open switch which is closed upon sensing said hand,
   a relay operatively coupled to each sensor switch for operation of relay contacts upon sensing an operator's hands near the respective target surfaces, the hands can but need not touch the covers, and
   means for connecting the relay contacts to said control output.

4. In combination with an industrial machine requiring proper positioning of both hands of an operator for machine operation, an operator control station for machine control comprising:
   a voltage supply circuit,
   a steel housing having a top wall,
   a pair of relatively widely spaced apertures in the top wall of the housing,
   a non-conductive polymer panel presenting a non-conductive exterior target surface covering each aperture and forming an exterior wall portion of the housing top wall,
   a pair of spaced apart capacitive proximity sensors inside the housing and connected to said voltage supply circuit, each sensor being adjacent an aperture and having a sensing field extending upwardly a distance beyond the exterior target surface of the panel for sensing an operator's hand which need not touch the panel outside of the respective aperture,
   a relay serially coupled to each sensor and the voltage supply means for switching relay outputs in response to sensing an operator's hands adjacent the respective panels, and terminal means connected to said relays and to the industrial machine for coupling the control station to the machine.

5. A method of activating an operator control station for a machine, the control station including a protective enclosure structure with substantially spaced apart exterior targets forming exterior wall portions of said enclosure and having a pair of activatable, signal producing, spaced apart capacitive proximity sensors within the enclosure structure behind the targets, each sensor having outwardly disposed radiating faces generating a local electrical field, and electrical circuitry including a voltage supply connecting the sensors to activate the machine when the sensors are activated, comprising the steps of:

a. electrically energizing the sensors and producing electrical fields extending a predetermined distance forwardly beyond the exterior targets;

b. moving each hand of an operator to a position spaced forwardly of the respective targets in which each hand enters one of said fields adjacent said sensor faces of the enclosure structure, without entering the enclosure structure; and c. simultaneously transmitting the signal produced by each sensor, by reason of the palms of the hands merely entering said fields without touching anything, to activate the machine.

* * * * *

UNITED STATES PATENT AND TRADEMARK OFFICE
CERTIFICATE OF CORRECTION

PATENT NO. : 5,212,621

DATED : May 18, 1993

INVENTOR(S) : Ronald L. Panter

It is certified that error appears in the above-identified patent and that said Letters Patent is hereby corrected as shown below:

Column 1, line 43, change "and" to -- hand --.

Column 4, line 41, delete "the" (second occurrence).

Signed and Sealed this

Fifteenth Day of March, 1994

BRUCE LEHMAN

Attest:

Attesting Officer

Commissioner of Patents and Trademarks